(12) United States Patent
Schultz et al.

(10) Patent No.: US 9,722,613 B1
(45) Date of Patent: Aug. 1, 2017

(54) CIRCUIT ARRANGEMENT FOR AND A METHOD OF ENABLING A PARTIAL RECONFIGURATION OF A CIRCUIT IMPLEMENTED IN AN INTEGRATED CIRCUIT DEVICE

(71) Applicant: Xilinx, Inc., San Jose, CA (US)

(72) Inventors: David P. Schultz, San Jose, CA (US); Weiguang Lu, San Jose, CA (US); Paige A. Kolze, Mountain View, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/867,461

(22) Filed: Sep. 28, 2015

(51) Int. Cl.
*H03K 19/177* (2006.01)

(52) U.S. Cl.
CPC ... *H03K 19/17756* (2013.01); *H03K 19/1774* (2013.01); *H03K 19/17728* (2013.01)

(58) Field of Classification Search
CPC ......... H03K 19/17728; H03K 19/1774; H03K 19/17756
See application file for complete search history.

(56) References Cited

U.S. PATENT DOCUMENTS

| | | | |
|---|---|---|---|
| 6,222,757 B1 * | 4/2001 | Rau | H03K 19/1776 365/154 |
| 7,424,655 B1 | 9/2008 | Trimberger | |
| 7,477,072 B1 | 1/2009 | Kao et al. | |
| 7,482,836 B2 | 1/2009 | Levi et al. | |
| 7,535,254 B1 | 5/2009 | Case | |
| 7,546,572 B1 | 6/2009 | Ballagh et al. | |
| 7,619,442 B1 | 11/2009 | Mason et al. | |
| 7,640,526 B1 | 12/2009 | Blodget et al. | |
| 7,640,527 B1 | 12/2009 | Dorairaj et al. | |
| 7,739,092 B1 | 6/2010 | Ballagh et al. | |
| 7,746,099 B1 | 6/2010 | Chan et al. | |
| 7,902,863 B1 | 3/2011 | Tetzlaff et al. | |
| 7,971,072 B1 | 6/2011 | Donlin et al. | |
| 7,973,556 B1 | 7/2011 | Noguera Serra et al. | |
| 8,099,625 B1 | 1/2012 | Tseng et al. | |
| 8,102,188 B1 | 1/2012 | Chan et al. | |
| 8,117,497 B1 | 2/2012 | Lesea | |
| 8,359,448 B1 | 1/2013 | Neuendorffer | |
| 8,415,974 B1 * | 4/2013 | Lysaght | H03K 19/17752 326/39 |
| 8,560,996 B1 | 10/2013 | Brebner et al. | |

(Continued)

*Primary Examiner* — Alexander H Taningco
*Assistant Examiner* — Kurtis R Bahr
(74) *Attorney, Agent, or Firm* — John J. King

(57) ABSTRACT

A circuit arrangement for enabling a partial reconfiguration of a circuit implemented in an integrated circuit device is described. The circuit arrangement comprises a plurality of circuit blocks, wherein each circuit block is configurable to implement a predetermined function and comprises a control circuit configured to receive a global enable signal and a plurality of global reconfiguration signals; and a routing network coupled to the plurality of circuit blocks for routing the global enable signal and the plurality of global reconfiguration signals to each circuit block of the plurality of circuit blocks; wherein each circuit block of the plurality of circuit blocks is configured to independently receive a local enable signal enabling a partial reconfiguration of the circuit in response to the plurality of global reconfiguration signals.

18 Claims, 6 Drawing Sheets

(56) References Cited

U.S. PATENT DOCUMENTS

| | | | |
|---|---|---|---|
| 8,633,730 B1 * | 1/2014 | Tseng | G06F 1/3287 |
| | | | 326/38 |
| 8,713,327 B1 | 4/2014 | Peterson et al. | |
| 8,719,750 B1 | 5/2014 | Balzli, Jr. | |
| 8,786,310 B1 * | 7/2014 | Lu | G06F 7/38 |
| | | | 326/38 |
| 8,928,351 B1 | 1/2015 | Konduru | |
| 9,038,072 B2 | 5/2015 | Nollet et al. | |
| 9,425,802 B1 * | 8/2016 | Xiao | H03K 19/17756 |
| 2005/0242835 A1 * | 11/2005 | Vadi | H03K 19/173 |
| | | | 326/37 |

* cited by examiner

CIRCUIT ARRANGEMENT FOR AND A METHOD OF ENABLING A PARTIAL RECONFIGURATION OF A CIRCUIT IMPLEMENTED IN AN INTEGRATED CIRCUIT DEVICE

TECHNICAL FIELD

The present invention relates generally to integrated circuit devices, and in particular, to a circuit arrangement for and a method of enabling a partial reconfiguration of a circuit implemented in an integrated circuit device.

BACKGROUND

Some integrated circuit devices include programmable resources that enable a user of the integrated circuit device to program circuits of the device to implement a selected circuit design. While programmable resources such as Configurable Logic Elements (CLEs) may be implemented in any type of integrated circuit device, such as an application specific integrated circuit (ASIC) having programmable resources, other devices are dedicated programmable logic devices (PLDs). The circuit design may be implemented in programmable resources of the device during an initial configuration, and may be altered after the initial configuration during a partial reconfiguration.

Partial reconfiguration is the ability to dynamically modify blocks of the programmable resources by downloading partial bit files, while the remaining programmable resources continue to operate without interruption. Partial reconfiguration allows designers to change functionality on the fly, eliminating the need to fully reconfigure and re-establish links with external hosts, memory devices, or transceivers. The use of partial reconfiguration can allow designers to move to fewer or smaller devices, reduce power, and improve system upgradability. Partial reconfiguration makes more efficient use of the device by only loading in functionality that is needed at any point in time. However, conventional methods of partial reconfigurations can lead to the unnecessary reprogramming or stoppage of programmable resources.

Accordingly, circuits and methods that lead to more efficient reprogramming of resources in an integrated circuit device are desirable.

SUMMARY

A circuit arrangement for enabling a partial reconfiguration of a circuit implemented in an integrated circuit device is described. The circuit arrangement comprises a plurality of circuit blocks, wherein each circuit block is configurable to implement a predetermined function and comprises a control circuit configured to receive a global enable signal and a plurality of global reconfiguration signals; and a routing network coupled to the plurality of circuit blocks for routing the global enable signal and the plurality of global reconfiguration signals to each circuit block of the plurality of circuit blocks; wherein each circuit block of the plurality of circuit blocks is configured to independently receive a local enable signal enabling a partial reconfiguration of the circuit in response to the plurality of global reconfiguration signals.

A method of enabling a partial reconfiguration of a circuit implemented in an integrated circuit device is also described. The method comprises implementing a plurality of circuit blocks in an integrated circuit device, wherein each circuit block is configurable to implement a predetermined function; routing a global enable signal and the plurality of global reconfiguration signals to each circuit block of a plurality of circuit blocks; and independently coupling a local enable signal to a control circuit of each circuit block of the plurality of circuit blocks, the local enable signal enabling a partial reconfiguration of the circuit block in response to the plurality of global reconfiguration signals.

Other features will be recognized from consideration of the Detailed Description and the Claims, which follow.

DETAILED DESCRIPTION

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

When partially reconfiguring a programmable device, it is desirable to isolate circuits and logic being reconfigured from circuits and logic that are intended to remain operational. It is also desirable that the reconfigured circuits and logic start operation in the new configuration from a known good state. These functions can be enabled through the use of signals, such as Global Configuration Control Signals (also known as Global Signals), that are distributed to all circuits and logic in the device. The circuits and methods set forth below enable the use of memory elements to selectively mask the effect of device-wide configuration control signals. The mask control allows parts of the device to remain operational while other parts are reconfigured. Further, the mask control granularity is on the level of individual functional blocks, as will be described in more detail below. That is, each circuit block of the plurality of circuit blocks is configured to independently receive a local enable signal enabling a partial reconfiguration of the circuit block in response to the plurality of global reconfiguration signals.

Figure 1:
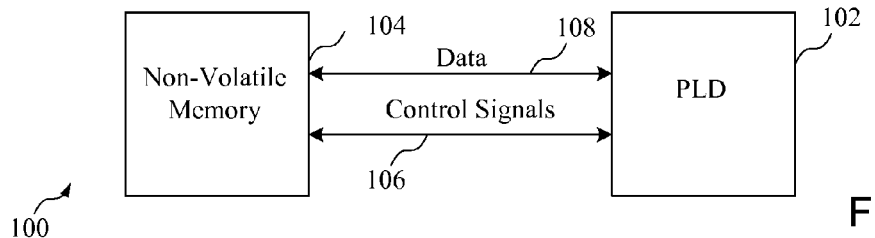
FIG. 1 is a block diagram of a system enabling the reconfiguration of a device having programmable resources.

Turning first to FIG. 1, a block diagram of a system 100 enabling the communication of data is shown. In particular, a programmable logic device 102 is coupled to a non-volatile memory 104 and enables the transfer of control signals by way of a first connection 106 and data signals by way of a second connection 108. As will be detail below, configuration bits for programming the programmable logic device are downloaded from the non-volatile memory 104 to the programmable logic device 102.

While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell. As will be described in more detail below, a partial bit file can be provided to the programmable logic device to enable a partial reconfiguration of the programmable logic device.

Figure 2:
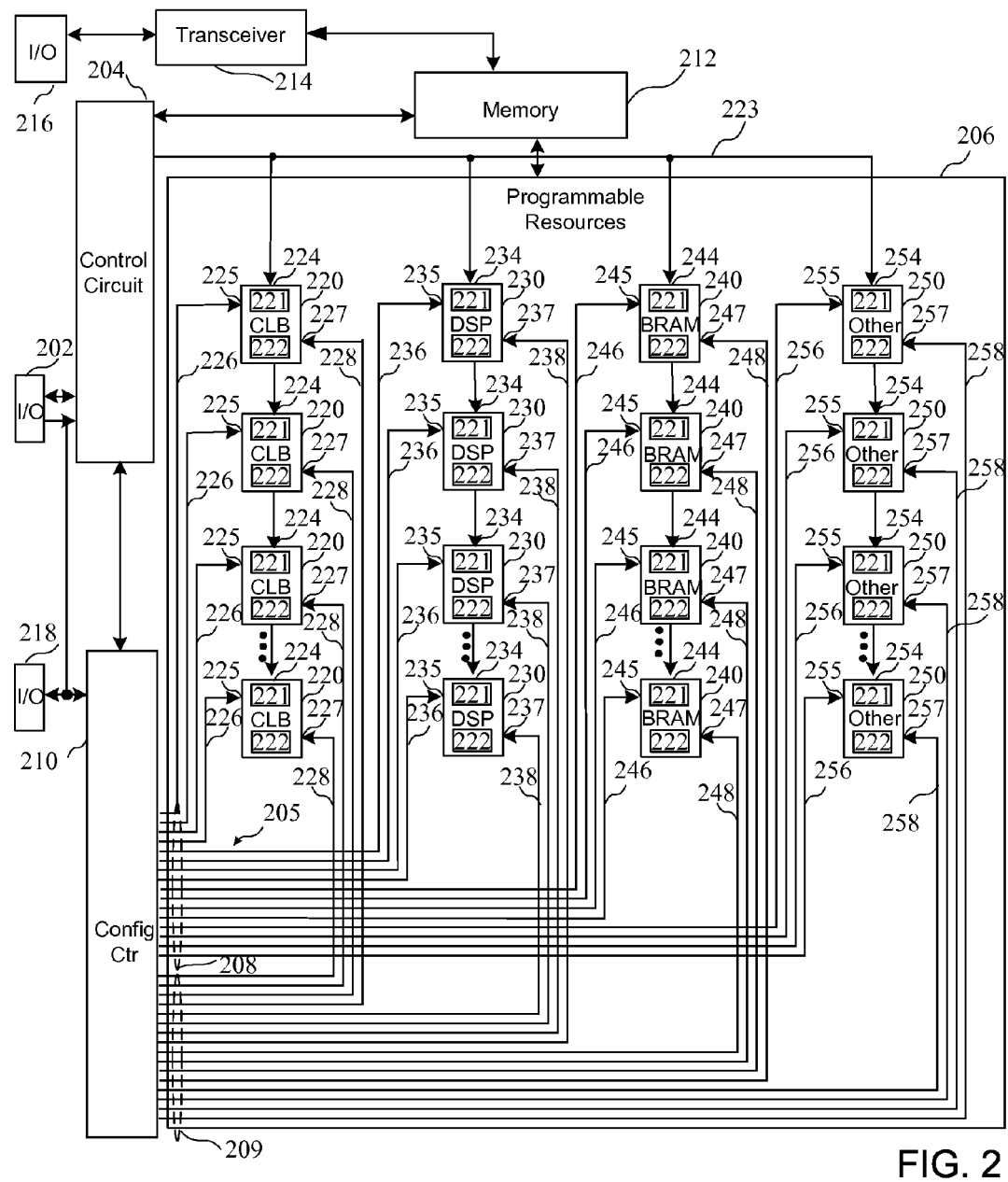
FIG. 2 is a block diagram of the programmable logic device of FIG. 1.

Turning now to FIG. 2, a block diagram of integrated circuit device having a plurality of programmable resources is shown. In particular, an input/output port 202 is coupled to a control circuit 204 that controls programmable resources 206 having configuration memory. Configuration data, including a complete file of bits to configure the programmable resources, or a partial bit file to enable a partial reconfiguration, may be provided to the configuration memory of the programmable resources 206 by a configuration controller 210 using a first routing network 205. The configuration data enables the operation of configurable resource 206, and may include memory bits comprising configuration bit functioning as control bits provided to the programmable resources by way of data lines 208 of the first routing network 205, or configuration bits for elements operating as a memory element, such as a CLB implemented as a lookup table (LUT) memory, by way of data lines 209 of the first routing network 205, as will be described in more detail below. A memory 212 may be coupled to the control circuit 204 and the programmable resources 206. A transceiver 214 may be coupled to an I/O port 216, and may transmit and receive signals. Other I/O ports may be coupled to circuits of the integrated circuit device, such as I/O port 218 that is coupled to the configuration controller 210 as shown.

The configuration memory associated with the programmable resources 206 are programmed by way of the first routing network 205. The first routing network 205 enables routing memory bits operating as enable signals to corresponding circuit blocks. In particular, a plurality of configurable logic blocks (CLBs) 220, which may comprise a control circuit 221 and programmable resources 222, are coupled to receive global signals from the control circuit 204 at inputs 224 by way of a second routing network 223. As will be described in more detail below, the control circuit 221 may be a circuit of the programmable resources that controls the operation of a circuit, while the programmable resources 222 may be a portion of the programmable resources that stores the configuration data, such as a lookup table (LUT) memory of a configurable logic block, for example. The routing network 223 could be used to provide global signals to each CLB of the plurality of CLBs. In contrast, the routing network 205 enables separately routing a local enable signal to individual circuit blocks so that each individual circuit block can be independently selected to be reconfigured during a partial reconfiguration. Each CLB can be coupled to receive a local enable signal at an input 225 by way of an interconnect line 226 coupled to the CLB. The local enable signal allows the CLB that receives the signal to be reconfigured during a partial reconfiguration. Each CLB is also coupled to receive configuration bits for reconfiguring the CLB at an input 227 by way of data interconnect lines 228.

Global and local signals are provided to other blocks in the circuit. For example, a plurality of digital signal processing (DSP) circuits 230 are coupled to receive signals, such as global control signals, from the control circuit 204 at inputs 234 by way of the routing network 223. The routing network 205 also enables separately routing a local enable signal to individual DSP blocks so that each individual DSP block can be independently selected to be reconfigured during a partial reconfiguration. Each DSP circuit can be coupled to receive a local enable signal at an input 235 by way of an interconnect line 236 coupled to the DSP. Each DSP is also coupled to receive configuration bits at an input 237 by way of data interconnect lines 238.

Global and local signals are provided to a plurality of blocks of random access memory (BRAMs) 240. Global control signals are received from the control circuit 204 at inputs 244 by way of the routing network 223. The routing network 205 also enables separately routing a local enable signal to individual BRAMs so that each individual BRAM can be independently selected to be reconfigured during a partial reconfiguration. Each BRAM can be coupled to receive a local enable signal at an input 245 by way of an interconnect line 246 coupled to the BRAM. Each BRAM is also coupled to receive configuration bits at an input 247 by way of data interconnect lines 248, where the configuration bits would be data stored in the BRAMS for example.

Finally, global and local signals are provided to a plurality of blocks of other blocks 250. Global control signals are received from the control circuit 204 at inputs 254 by way of the routing network 223. The routing network 205 also enables separately routing a local enable signal to other blocks. Each of the other blocks can be coupled to receive a local enable signal at an input 255 by way of an interconnect line 256 coupled to the BRAM. Each of the blocks 250 is also coupled to receive configuration bits at an input 257 by way of data interconnect lines 258. Examples of the other blocks could include input/output blocks, data transceivers, interface elements, system monitor blocks, bus controller blocks, such as Peripheral Component Interconnect Express (PCIe) controller blocks, Ethernet Media Access Controller (MAC) blocks, Interlaken blocks, etc. The circuits and methods set forth in more detail below may be implemented within a single integrated circuit die, or may be implemented in a multi-chip module or some other system enabling the transfer of data.

Figure 3:
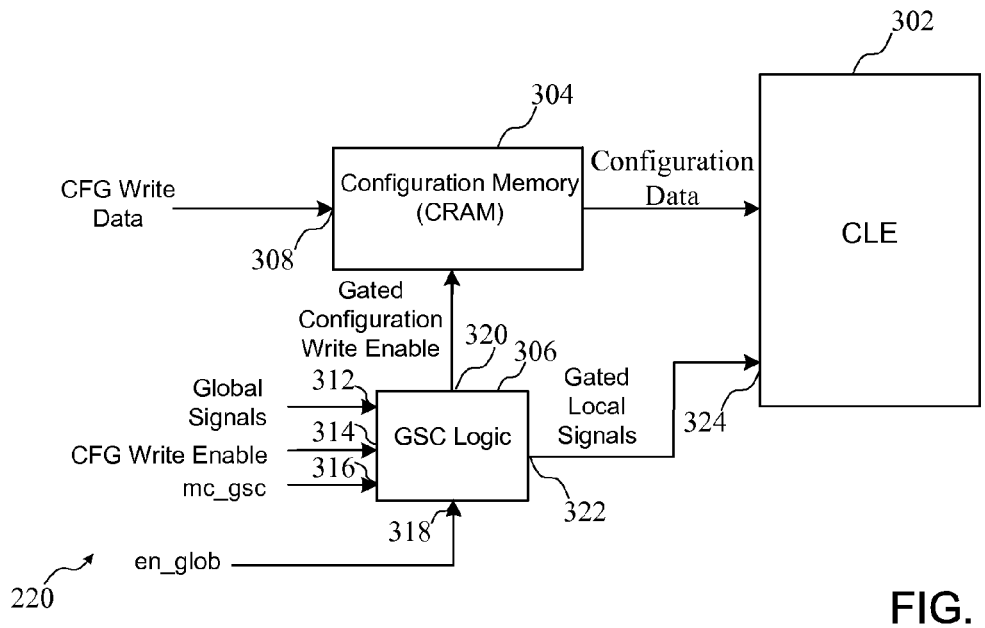
FIG. 3 is a block diagram of a configurable logic block of FIG. 2.

Turning now to FIG. 3, a block diagram of a configurable logic block of FIG. 2 is shown. The CLB 220 comprises a configurable logic element (CLE) 302, which will be described in more detail in reference to FIG. 6. The CLB comprises configuration memory (CRAM) 304 and gating logic 306. The control circuit 221 of FIG. 2 could comprise the gating logic 306, where a local enable signal, such as mc_gsc, could control the operation of the gating logic circuit 306. Similarly, the configuration memory elements associated with the programmable resources 222 comprise the configuration memory 304. Accordingly, the circuit of FIG. 2 both providing gated local signals to the CLE to control the operation of the CLE, as well as a gated configuration write enable signal which enables the ability to write to the configuration memory of the CLE, such as a LUT memory. The configuration memory receives configuration (CFG) write data to be written to the configuration memory at an input 308 in response to the gated configuration write enable signal. The configuration data stored in the configuration memory 304 enables the operation of the CLE, as will be described in more detail below in reference to FIGS. 4-6.

The gating logic 306 is coupled to receive the global signals at an input 312, a configuration write enable signal at an input 314, and the local enable signal mc_gsc at an input 316. The various global and local enable signals will be described in more detail below in reference to FIG. 4. A description of a circuit enabling storing data in configuration memory will be described in more detail in reference to FIG. 5. It should be noted that the local enable signal mc_gsc could be a memory bit stored in the configuration memory, as set forth above. The gating logic 306 also receives a global enable (en_glob) signal at an input 318. Gated local signals generated at an output 322 are coupled to an input 324, as will be described in more detail below. Therefore, the global enable signal allows the local enable (mc_gsc) to be ignored, and all of the programmable resources to be reconfigured during a full reconfiguration. The local enable signal allows some configuration memory elements to be reconfigured based upon configuration write data provided during a partial reconfiguration, where a gated reconfiguration write enable signal associated with certain configuration memory cells, such as the configuration memory cells associated with a CLB for example, is generated in response to the local enable signal provided to that CLB.

Figure 4:
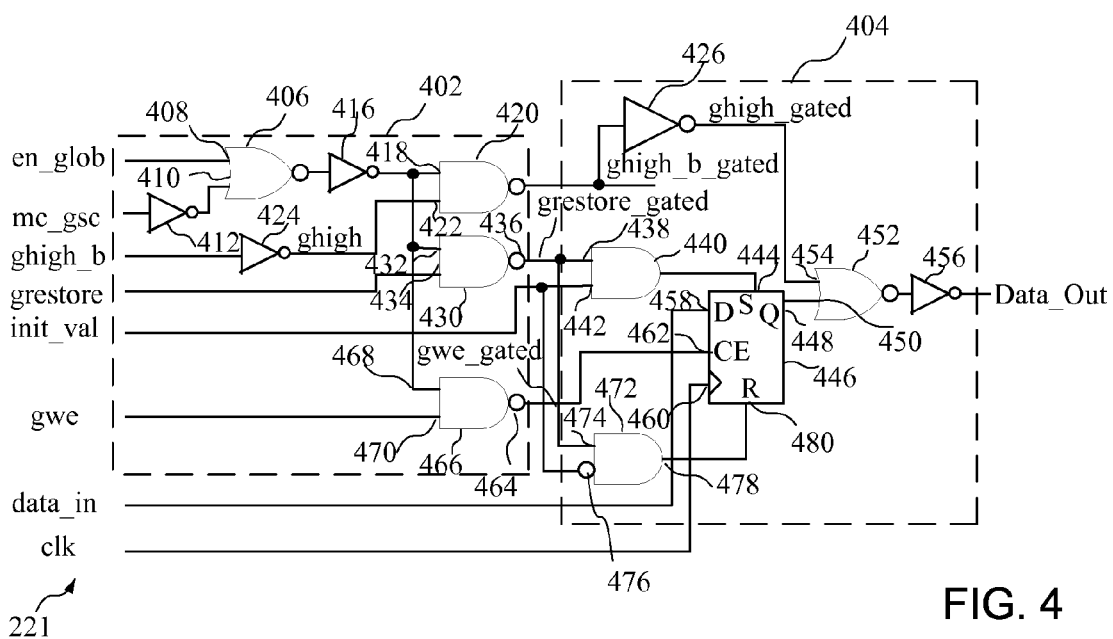
FIG. 4 is a block diagram of a portion of the configurable logic block of FIG. 2.

Turning now to FIG. 4, a block diagram of a portion of the configurable logic block of FIG. 3 is shown. Before describing the circuit elements of FIG. 4, specific Global Configuration Control Signals that can be routed to the reconfigurable memory element of FIG. 4 of any of the programmable resources of FIG. 2 will be described. The Global Configuration Control Signals include GHIGH, GRESTORE, GWE, and GTS_CFG, which may be sequenced during configuration and partial reconfiguration events. Each signal has one or more functions that is specific to the configuration process. The function of the global high (GHIGH) signal is to force the outputs of functional blocks (which may be inputs to programmable interconnects for example) to a logical 1 level (i.e. a high voltage level). This function is intended to prevent contention in the interconnect structure during configuration when the programming may be undesirable. In some functional blocks, GHIGH is used to force inputs coming from memory cells to 0. This prevents the effects of temporary memory cell value changes from causing contention internal to the functional block. The function of the global restore (GRESTORE) signal is to asynchronously initialize register elements or other states inside a functional block. The initialization value may be fixed or may be specified by configuration memory cells. The function of a global write enable (GWE) signal is to prevent state change in the register elements of a functional block during the configuration process. For example, the flip-flops in a CLE are initialized by assertion of GRESTORE, and then GWE prevents the state from changing until it asserted. The function of global configuration (GTS_CFG) signal is to force the FPGA's external IO drivers into tristate mode.

The GSC bits and logic have the function of selectively "masking" the effects of these Global Signals for functional blocks which are intended to continue functioning during a partial reconfiguration (PR) event. An additional global enable signal (EN_GLOB) allows override of the state of the GSC bits. This signal is asserted during initial configuration in order to allow the Global Signals to be in effect throughout the entire device. The global enable signal and the local enable signal determine whether or not a configurable block will respond to a shutdown sequence, which is a sequence of changes in the logical states of the global signals. While particular global signals are described, it should be understood that different or additional global signals could be implemented, where a particular global signal may be specific to a particular type of circuit block. While the different or additional global signal would be routed to each circuit block of the particular type of circuit block, local reconfiguration signals associated with the different or additional global signal based upon a local enable signal, as described in more detail below.

Referring now to the elements of FIG. 4, a control circuit 402 is coupled to control a memory element 404. The control circuit 402 comprises a NOR gate 406 having a first input 408 coupled to receive a global enable (en_glob) signal and a second input 410 coupled to receive an output of an inverter 412 that receives a local enable signal (mc_gsc) at an input. As will be described in more detail below, the global enable signal is routed to each function block of the programmable resources to enable a full reconfiguration of an integrated circuit device. Alternatively, the local enable signal (mc_gsc) enables the independent reconfiguration of the functional block to which it is applied. That is, the local enable signals separately coupled to the plurality of circuit blocks enable selectively reconfiguring predetermined functional blocks during a partial reconfiguration. The output of the NOR gate 406 is a local reconfiguration signal that is generated for the circuit block associated with the control circuit 402.

An inverter 416 is coupled to the output of the NOR gate 406, and output of which is coupled to an input 418 of a NAND gate 420. The NAND gate 420 is a gating circuit enabling the generation of local reconfiguration signals, as will be described in more detail below. A second input 422 of the NAND gate 420 is coupled to an output of an inverter 424 receiving an inverted global high (ghigh_b) signal at an input. An inverted gated global high (ghigh_b_gated) is generated at output of the NAND gate 420, while a gated global high (ghigh_gated) signal is generated at an output of an inverter 426. A second NAND gate 430 is coupled to receive the output of the inverter 416 at an input 432 and the global restore signal (grestore) at an input 434. An output 436 of the NAND gate 430 is coupled to an input 438 of an AND gate 440 that is coupled to receive an initial value (init_value) at a second input 442.

An output of the AND gate 440 is coupled to an input 444, which comprises a set input, of a register 446. An output 448 of the register is coupled to a first input 450 of a NOR gate 452 that is coupled to receive the gated ghigh input signal at a second input 454. An output of the NOR gate 452 is coupled to an input of an inverter 456 that generates output data (Data_Out) based upon data provided to an input 458 of the register 446.

The register also receives a clock (clk) signal at a clock input 460 and a clock enable (CE) signal at an input 462. The clock enable signal is generated at an output 464 of a NAND gate 466 that is coupled to receive the output of the inverter 416 at an input 468 and a global write enable signal at an input 470. An AND gate 472 is coupled to the output 436 of the NAND gate 430 at an input 474, and to receive the initial value at an inverted input 476. An output 478 of the AND gate 472 is couple to a reset input 480 of the register 446.

It should be noted that the circuit of FIG. 4 is provided by way of example to show the generation of a local reconfiguration signal by the NOR gate 406 and the implementation of a plurality of gating circuits, such as NAND gates 420, 430 and 466 of the control circuit 402, could be implemented in any circuit block. That is, the NOR gate and the gating circuits of the control circuit 402 enable generation of local reconfiguration signals associated with a circuit block controlled by control circuit 402. The local enable signal either enables or disables the effect of global control signals, which are distributed chip-wide, that prepare the circuit for reconfiguration through a "shutdown" sequence. After reconfiguration, the circuit is brought back into operation mode with new programming during startup. In the example of FIG. 4, the local reconfiguration signals are designated as with a "gated" designation at the end of the signals such as ghigh_gated, which represents a local global high signal based upon the global high signal. The local reconfiguration signals have the same function as the global reconfiguration signals, but are only applied locally to a given circuit block. Therefore, the control circuit 402 of FIG. 4 could be implemented as the control circuit 221 enabling the generation of local reconfiguration signals for a given circuit block based upon global reconfiguration signals provided to all of the circuit blocks. Further, while the circuit of FIG. 4 shows the partial reconfiguration of a register of the CLE of FIG. 3, it should be understood that the control circuit 402 could be implemented to enable the partial reconfiguration of other portions of a CLE, such as a LUT configured as a memory element. Reconfiguring portions of a CLE is described in reference to FIG. 5.

Figure 5:
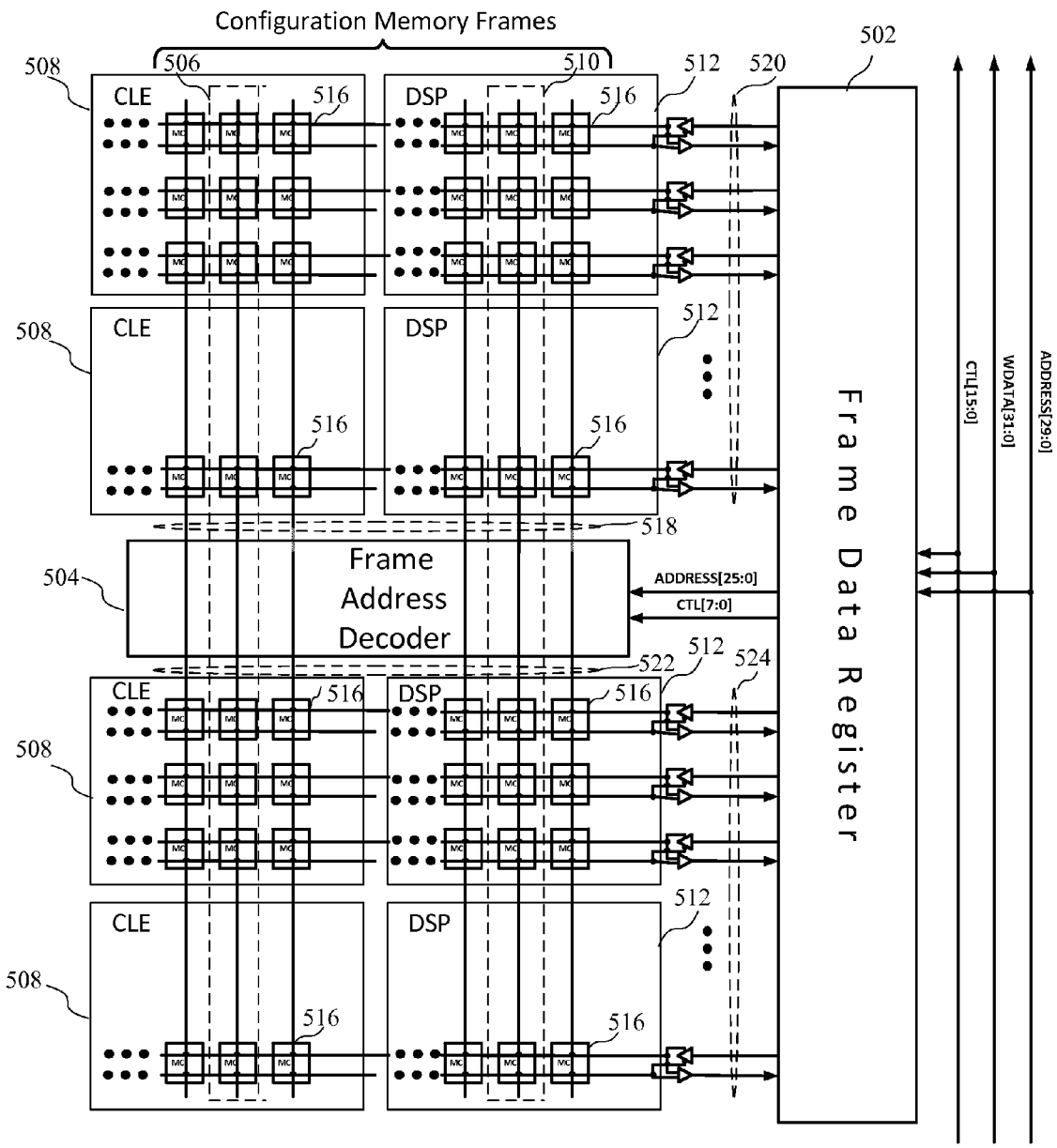
FIG. 5 is a block diagram of a circuit enabling the reconfiguration of memory cells associated with programmable resources of an integrated circuit.

Turning now to FIG. 5, a block diagram of a circuit enabling the reconfiguration of memory cells associated with configurable blocks associated with an integrated circuit is shown. The circuit of FIG. 5 enables selectively configuring portions of the programmable resources, where address, data and control signals could be generated based upon local write enable signals, such as gated configuration write enable signals generated by the gating logic 306 of FIG. 3. A frame data register 502 is coupled to a frame address decoder 504. The frame data register 502 and the frame address decoder 504 are associated with a plurality of configuration memory frames, including for example configuration memory frame 506 associated with a plurality of CLE blocks 508 and configuration memory frame 510 associated with a plurality of DSP blocks 512. Each of the CLE and DSP blocks are configured by memory cells (MC) 516. The frame address decoder 504 provides address and control signals by way of signal lines 518 to enable selectively programming memory elements associated with the CLEs and DSPs for a first portion of the frames above the frame address decoder 504, where data is provided to or received from the CLEs and DSPs by way of a data signal lines 520. The frame address decoder 504 also provides address and control signals by way of signal lines 522 to enable selectively programming memory elements associated with the CLEs and DSPs for a second portion below the frame address decoder 504, where data is provided to or received from the CLEs and DSPs by way of a data signal lines 524. Accordingly, changes to configuration memory space can be controlled based upon the gated configuration write enable signals as described in FIG. 5, for example, where appropriate address and control signals are generated for writing data to the configuration memory frames.

Figure 6:
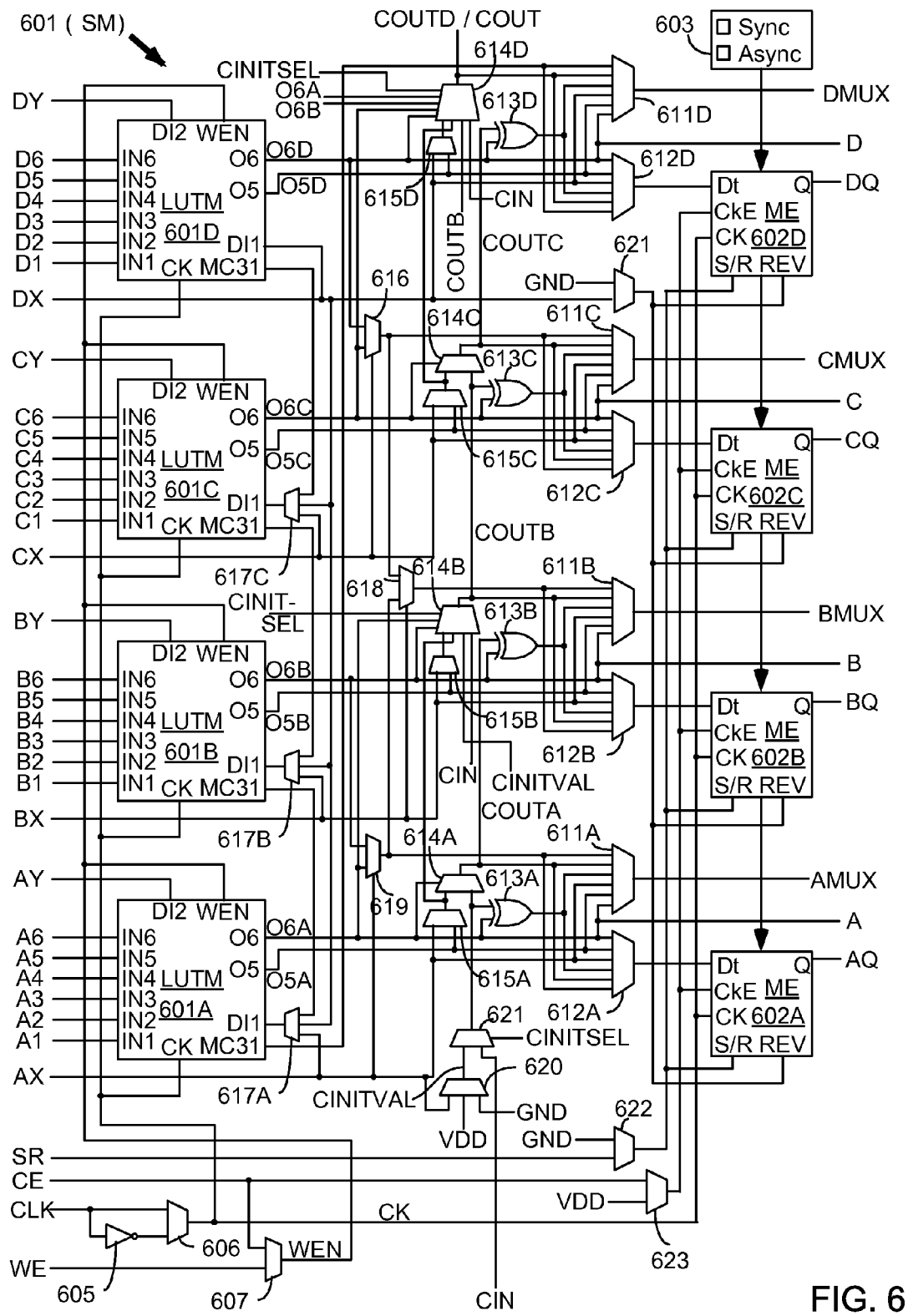
FIG. 6 is a block diagram of the configurable logic element of FIG. 3.

Turning now to FIG. 6, block diagram of a configurable logic element of the implemented in a configurable logic block of the device of FIG. 2 is shown. In the implementation of FIG. 6, slice M 601 includes four lookup tables (LUTMs) 601A-601D, each driven by six LUT data input terminals A1-A6, B1-B6, C1-C6, and D1-D6 and each providing two LUT output signals O5 and O6. The O6 output terminals from LUTs 601A-601D drive slice output terminals A-D, respectively. The LUT data input signals are supplied by the FPGA interconnect structure via input multiplexers, which may be implemented by programmable interconnect element 611, and the LUT output signals are also supplied to the interconnect structure. Slice M also includes: output select multiplexers 611A-611D driving output terminals AMUX-DMUX; multiplexers 612A-612D driving the data input terminals of memory elements 602A-602D; combinational multiplexers 616, 618, and 619; bounce multiplexer circuits 622-623; a circuit represented by inverter 605 and multiplexer 606 (which together provide an optional inversion on the input clock path); and carry logic having multiplexers 614A-614D, 615A-615D, 620-621 and exclusive OR gates 613A-613D. All of these elements are coupled together as shown in FIG. 6. Where select inputs are not shown for the multiplexers illustrated in FIG. 6, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 6 for clarity, as well as from other selected figures herein.

In the pictured embodiment, each memory element 602A-602D may be programmed to function as a synchronous or asynchronous flip-flop or latch. The selection between synchronous and asynchronous functionality is made for all four memory elements in a slice by programming Sync/Asynch selection circuit 603. When a memory element is programmed so that the S/R (set/reset) input signal provides a set function, the REV input terminal provides the reset function. When the memory element is programmed so that the S/R input signal provides a reset function, the REV input terminal provides the set function. Memory elements 602A-602D are clocked by a clock signal CK, which may be provided by a global clock network or by the interconnect structure, for example. Such programmable memory elements are well known in the art of FPGA design. Each memory element 602A-602D provides a registered output signal AQ-DQ to the interconnect structure. Because each LUT 601A-601D provides two output signals, O5 and O6, the LUT may be configured to function as two 5-input LUTs with five shared input signals (IN1-IN5), or as one 6-input LUT having input signals IN1-IN6.

In the implementation of FIG. 6, each LUTM 601A-601D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 617A-617C for LUTs 601A-601C), or to the two 32-bit RAMs via input terminals DI1 and DI2. RAM write operations in the LUT RAMs are controlled by clock signal CK from multiplexer 606 and by write enable signal WEN from multiplexer 607, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 601A may also be provided to the general interconnect structure for shift register chaining, via output select multiplexer 611D and CLE output terminal DMUX.

Figure 7:
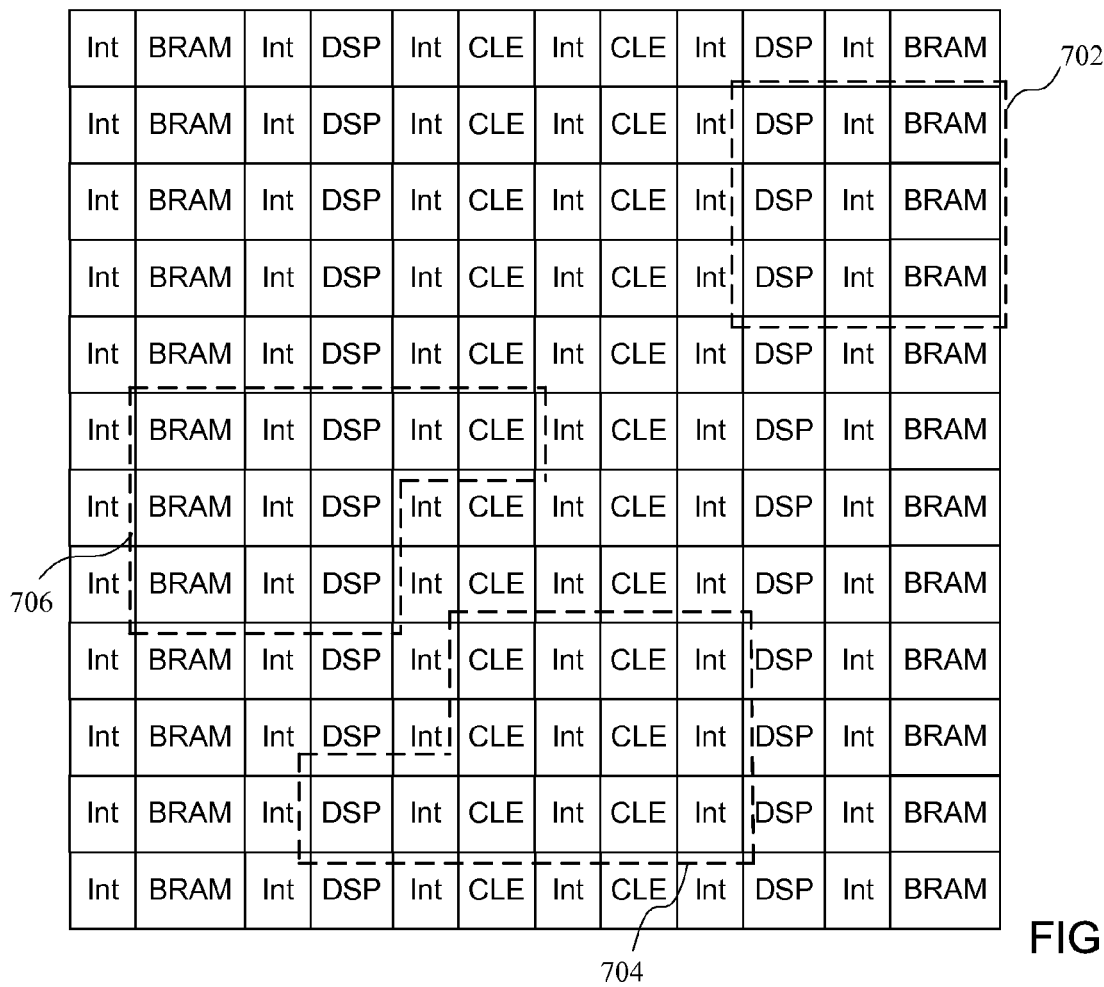
FIG. 7 is a block diagram of a portion of an integrated circuit having programmable resources.

Turning now to FIG. 7, a block diagram of a portion of an integrated circuit having programmable resources is shown. As shown in FIG. 7, different regions 702, 704 and 706 of the portion of the integrated circuit of FIG. 7 are reconfigured during a partial reconfiguration. As can be seen in FIG. 7, the different regions 702, 704 and 706 comprise different blocks of programmable resources, and are not confined to a predetermined arrangement of elements, such as a row or column of elements. Rather, because each of the elements of the integrated circuit can be individually reprogrammed, regions that are partially reprogrammed can include any combination of elements in any area. While particular types of circuit blocks are shown in FIG. 7 by way of example, it should be understood that partial reconfiguration based upon local control signals can be implemented in all of the available circuit blocks of an integrated circuit device, including other types such as types of circuit blocks such as input/output blocks, data transceivers, interface elements, such as PCIE interface elements, system monitor blocks, Ethernet Media Access Controller (MAC) blocks, Interlaken blocks, etc.

Figure 8:
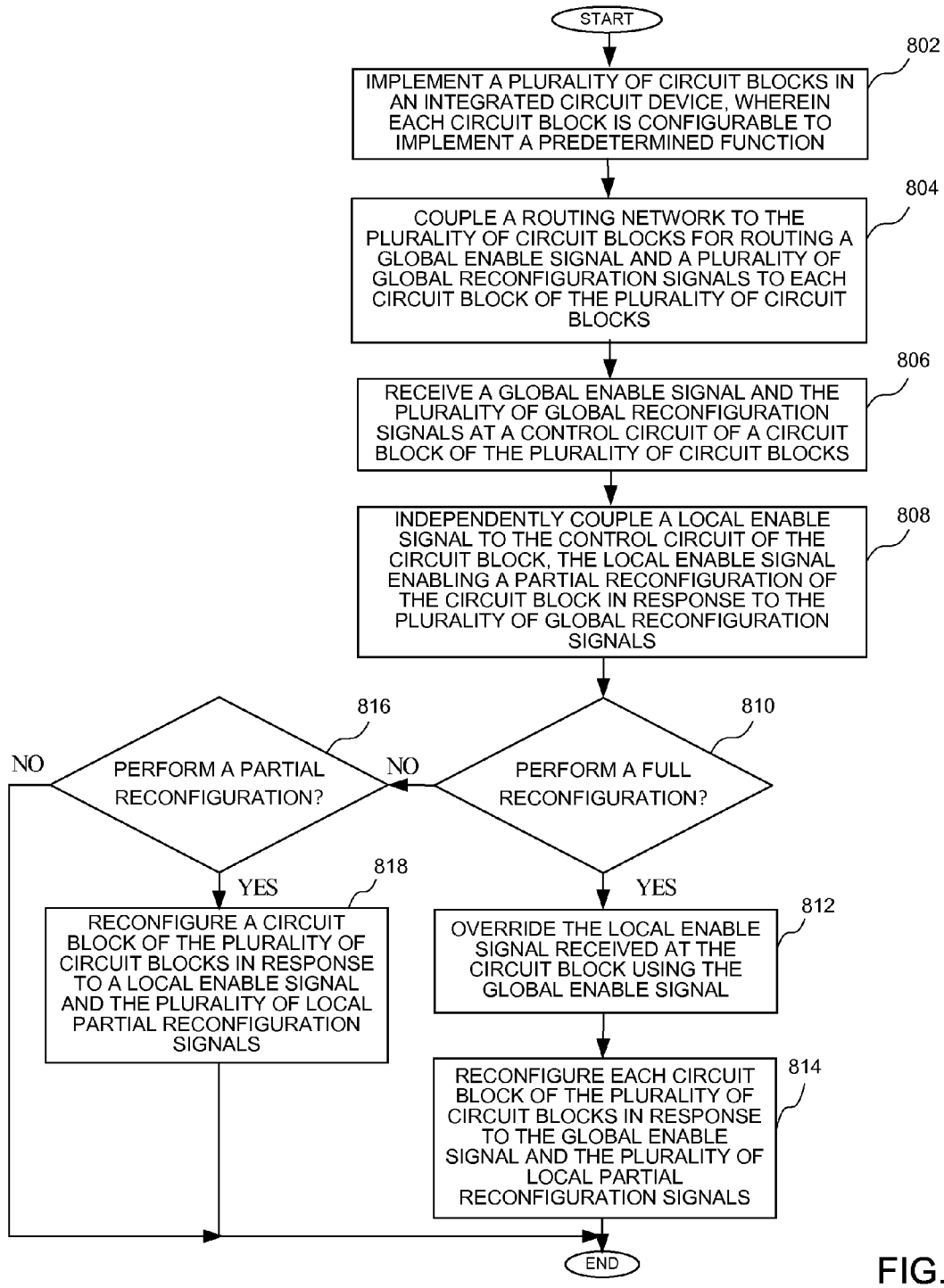
FIG. 8 is a flow chart showing a method of enabling the reconfiguration of a device having programmable resources.

Turning now to FIG. 8, a flow chart shows a method of enabling the reconfiguration of a device having programmable resources. In particular, a plurality of circuit blocks are implemented in an integrated circuit device, wherein each circuit block is configurable to implement a predetermined function at a block 802. A routing network is coupled to the plurality of circuit blocks for routing a global enable signal and a plurality of global reconfiguration signals to each circuit block of the plurality of circuit blocks at a block 804. The global enable signal, such as the en_glob signal, and the plurality of global reconfiguration signals are received at a control circuit of a circuit block of the plurality of circuit blocks at a block 806. The global enable signal is generally asserted on full-chip reset or after a power-cycle. It remains asserted until after an initial configuration of a device and a startup sequence have been completed. A local enable signal, such as the mc_gsc signal, is independently coupled to the control circuit of the circuit block at a block 808, the local enable signal enabling a partial reconfiguration of the circuit block in response to the plurality of global reconfiguration signals as described above in reference to FIGS. 1-7.

It is then determined whether it is necessary to perform a full reconfiguration at a block 810. If a full reconfiguration is to be performed, the local enable signal received at the circuit block is overridden using the global enable signal at block 812, and each circuit block of the plurality of circuit blocks is reconfigured in response to the global enable signal and the plurality of global reconfiguration signals at a block 814. If a full reconfiguration is not necessary, it is then determined whether a partial reconfiguration is to be performed at a block 816. If so, a circuit block of the plurality of circuit blocks is reconfigured at a block 818 in response to a local enable signal and the plurality of local reconfiguration signals.

It can therefore be appreciated that new circuits for and methods of enabling partial reconfiguration in an integrated circuit has been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. A circuit arrangement for enabling a partial reconfiguration of a circuit implemented in an integrated circuit device, the circuit arrangement comprising:
   a plurality of configurable logic blocks, wherein each configurable logic blocks has a lookup table and is configurable to implement a predetermined function and comprises a control circuit configured to receive a global enable signal and a plurality of global reconfiguration signals; and
   a routing network coupled to the plurality of configurable logic blocks for routing the global enable signal and the plurality of global reconfiguration signals to each configurable logic block of the plurality of configurable logic blocks;
   wherein each configurable logic block of the plurality of configurable logic blocks is configured to independently receive a local enable signal enabling a partial reconfiguration of the plurality of configurable logic blocks in response to the plurality of global reconfiguration signals; and
   wherein the control circuit generates a reconfiguration enable signal in response to either the global enable signal or the local enable signal, and the reconfiguration enable signal generated in response to the local enable signal enables the partial reconfiguration of the plurality of configurable logic blocks using local configuration signals based upon the global reconfiguration signals.

2. The circuit arrangement of claim 1, wherein the global enable signal enables a reconfiguration of each of the configurable logic blocks of the plurality of configurable logic blocks.

3. The circuit arrangement of claim 1, wherein the global enable signal overrides the local enable signal.

4. The circuit arrangement of claim 3, wherein each configurable logic block of the plurality of configurable logic blocks is reconfigured in response to the global enable signal and a plurality of local reconfiguration signals.

5. The circuit arrangement of claim 1, wherein the plurality of global reconfiguration signals comprises a global interconnect control signal, a global write enable signal, and a global reset signal.

6. The circuit arrangement of claim 1, further comprising digital signal processor blocks, blocks of random access memory, input/output blocks, bus controller blocks, Ethernet MAC blocks, and Interlaken blocks.

7. The circuit arrangement of claim 1, wherein each configurable logic block of the plurality of configurable logic blocks has a register configured to receive the local reconfiguration signals.

8. The circuit arrangement of claim 1, wherein the control circuit further comprises a plurality of gating circuits configured to receive the plurality of global reconfiguration signals and generate the local reconfiguration signals.

9. The circuit arrangement of claim 8, wherein the plurality of gating circuits comprises at least one gating circuit from a group consisting of a first gating circuit configured to receive a global interconnect control signal and generate a local interconnect control signal, a second gating circuit configured to receive a global write enable signal and generate a local write enable signal, and a third gating circuit configured to receive a global restore signal and generate a local restore signal.

10. A method of enabling a partial reconfiguration of a circuit implemented in an integrated circuit device, the method comprising:
    implementing a plurality of configurable logic blocks in an integrated circuit device, wherein each configurable logic block has a lookup table and is configurable to implement a predetermined function;
    routing a global enable signal and the plurality of global reconfiguration signals to each configurable logic block of a plurality of configurable logic blocks; and
    independently coupling a local enable signal to a control circuit of each configurable logic block of the plurality of configurable logic blocks, the local enable signal enabling a partial reconfiguration of the plurality of configurable logic blocks in response to the plurality of global reconfiguration signals; and
    generating a reconfiguration enable signal in response to either the global enable signal or the local enable signal;
    wherein the reconfiguration enable signal generated in response to the local enable signal enables the partial reconfiguration of the plurality of configurable logic blocks using local configuration signals based upon the global reconfiguration signals.

11. The method of claim 10, further comprising reconfiguring each configurable logic block of the plurality of configurable logic blocks in response to the global enable signal.

12. The method of claim 11, further comprising overriding the local enable signal received at the configurable logic block of the plurality of configurable logic blocks using the global enable signal.

13. The method of claim 12, further comprising generating a plurality of local reconfiguration signals based upon the global reconfiguration signals, and reconfiguring each configurable logic block of the plurality of configurable logic blocks in response to the global enable signal and the plurality of local reconfiguration signals.

14. The method of claim 10, wherein receiving a plurality of global reconfiguration signals comprises receiving a global interconnect control signal, a global write enable signal, and a global reset signal.

15. The method of claim 10, further comprising implementing digital signal processor blocks, blocks of random access memory, input/output blocks, bus controller blocks, Ethernet MAC blocks, and Interlaken blocks.

16. The method of claim 10, wherein each configurable logic block of the plurality of configurable logic blocks has a register configured to receive the reconfiguration signals.

17. The method of claim 10, further comprising implementing a plurality of gating circuits configured to receive the plurality of global reconfiguration signals and generate the local reconfiguration signals.

18. The method of claim 17, wherein implementing a plurality of gating circuits comprises implementing at least one gating circuit from a group consisting of a first gating circuit for receiving a global interconnect control signal and generating a local interconnect control signal, a second gating circuit for receiving a global write enable signal and generating a local write enable signal, and a third gating circuit for receiving a global restore signal and generating a local restore signal.

* * * * *